(12) United States Patent
Chang et al.

(10) Patent No.: US 12,131,725 B2
(45) Date of Patent: Oct. 29, 2024

(54) ELECTRONIC SYSTEM WITH HEAT DISSIPATION AND NOISE REDUCTION FUNCTION AND RELATED ACOUSTIC FILTER

(71) Applicant: Acer Incorporated, New Taipei (TW)

(72) Inventors: Jia-Ren Chang, New Taipei (TW); Ruey-Ching Shyu, New Taipei (TW); Feng-Ming Liu, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 266 days.

(21) Appl. No.: 17/898,939

(22) Filed: Aug. 30, 2022

(65) Prior Publication Data

US 2023/0306945 A1    Sep. 28, 2023

(30) Foreign Application Priority Data

Mar. 28, 2022   (TW) .................................. 111111698

(51) Int. Cl.
*G10K 11/16* (2006.01)
*G10K 11/172* (2006.01)
*H05K 7/20* (2006.01)

(52) U.S. Cl.
CPC .......... *G10K 11/172* (2013.01); *G10K 11/161* (2013.01); *H05K 7/20172* (2013.01)

(58) Field of Classification Search
CPC . G06F 1/20; G06F 1/182; G06F 1/203; G06F 1/181; G11B 33/08; G11B 33/142; H05K 7/20172; H05K 7/20181; H05K 7/20145; H05K 7/20136; H05K 7/20918; G10K 11/16; G10K 11/161; G10K 11/172; G10K 11/002; G10K 2210/11; F24F 13/24; F24F 2013/247; F24F 2013/242

(Continued)

(56) References Cited

U.S. PATENT DOCUMENTS 7,712,576 B2 *  5/2010  Goto ....................... G06F 1/182
                                                              181/205
8,862,017 B2 * 10/2014  Rodriguez ............. G03G 21/20
                                                              399/92

(Continued)

FOREIGN PATENT DOCUMENTS

JP         2001222065 A      8/2001

OTHER PUBLICATIONS

TW Office Action, Dec. 8, 2022, 9 pages.
TW Search Report, Dec. 2, 2022, 1 page.

*Primary Examiner* — Mandeep S Buttar
(74) *Attorney, Agent, or Firm* — Edell, Shapiro & Finnan, LLC (57) ABSTRACT

An electronic system includes an air vent, a heat sink, a fan, and an acoustic filter. The acoustic filter is disposed between the air vent and the heat sink and includes a sound-receiving opening, a sound-emitting opening, an expansion chamber, a neck channel, and a resonant chamber. The neck channel includes a first opening and a second opening whose surface is perpendicular to the surface of the sound-receiving opening. The first opening is in communication with the expansion chamber. The resonant chamber is connected to the second opening. Fan noise that enters the resonant chamber via the neck tube is dampened by reflective acoustic waves generated by the resonant chamber.

18 Claims, 6 Drawing Sheets

(58) Field of Classification Search
USPC .......... 361/697, 690, 694, 695, 679.34, 688;
181/224, 225, 284, 292; 454/906;
165/104.33
See application file for complete search history.

(56) References Cited

U.S. PATENT DOCUMENTS

| | | |
|---|---|---|
| 9,305,539 B2* | 4/2016 | Lind .......................... F24F 7/04 |
| 10,371,171 B2* | 8/2019 | Cocks ..................... H02P 23/00 |
| 11,388,837 B2* | 7/2022 | Waters ................... G10K 11/16 |
| 2011/0121654 A1 | 5/2011 | Recker et al. |
| 2017/0221526 A1* | 8/2017 | Albrecht .............. G11B 33/144 |
| 2021/0173456 A1* | 6/2021 | Kulkarni ............ H05K 7/20163 |

* cited by examiner

FIG.4

ELECTRONIC SYSTEM WITH HEAT DISSIPATION AND NOISE REDUCTION FUNCTION AND RELATED ACOUSTIC FILTER

This application claims the benefit of Taiwan Application Serial No. 111111698, filed Mar. 28, 2022, the subject matter of which is incorporated herein by reference in its entirety.

TECHNICAL FIELD

The present invention provides an electronic system and a related acoustic filter, particularly an electronic system and a related acoustic filter with heat dissipation and noise reduction capabilities.

BACKGROUND

Computer systems have become an indispensable tool for most people. In order to avoid power reduction to, or damage of, components due to overheating, computer systems generally use a fan to provide heat dissipation, so as to discharge heat generated inside the device and/or to draw in cool air from outside of the device.

The speed and static pressure of the fan determine the air flow of the fan. Fan noise is proportional to the speed of the fan. That is, the faster the speed of the fan, the greater the heat dissipation. However, this greater heat dissipation comes at a cost of greater fan noise.

As the functionality of a central processing unit (CPU) increases, so does the heat generated inside the CPU. In addition, the trend of computer system miniaturization continues to reduce heat flow efficiency. Thus, an effective strategy for balancing heat dissipation and noise reduction is of interest to those skilled in the art.

SUMMARY

In accordance with an embodiment, an electronic system includes a system air vent, a heat sink, a fan disposed adjacent a first side of the heat sink, and an acoustic filter disposed between the system air vent and a second side of the heat sink, wherein the acoustic filter comprises an expansion chamber and a resonant cavity connected to the expansion chamber via a neck channel.

In accordance with another embodiment, an electronic system includes a system air vent, a heat sink, a fan disposed adjacent a first side of the heat sink, and an acoustic filter disposed between the system air vent and a second side of the heat sink, wherein the acoustic filter comprises a front duct, a back duct, an expansion chamber disposed between the front duct and the back duct, and a resonant cavity connected, via a neck channel, to the expansion chamber between the front duct and the back duct.

BRIEF DESCRIPTION OF THE DRAWINGS

Embodiments are described herein in conjunction with the accompanying drawings, in which.

DESCRIPTION OF EXAMPLE EMBODIMENTS

Figure 1:
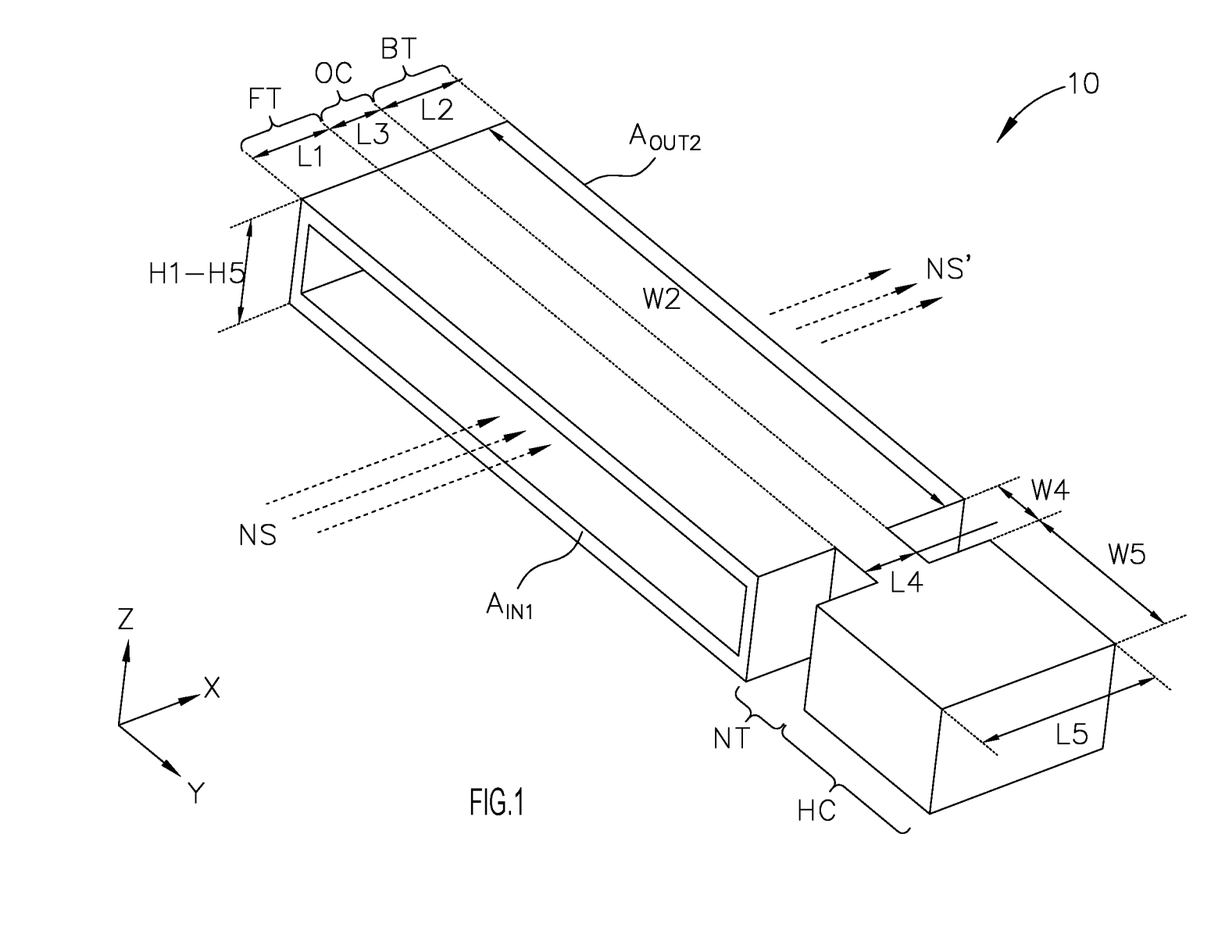
FIG. 1 is a schematic diagram of an acoustic filter that can provide noise reduction functionality according to an embodiment of the present invention.
Figure 2A:
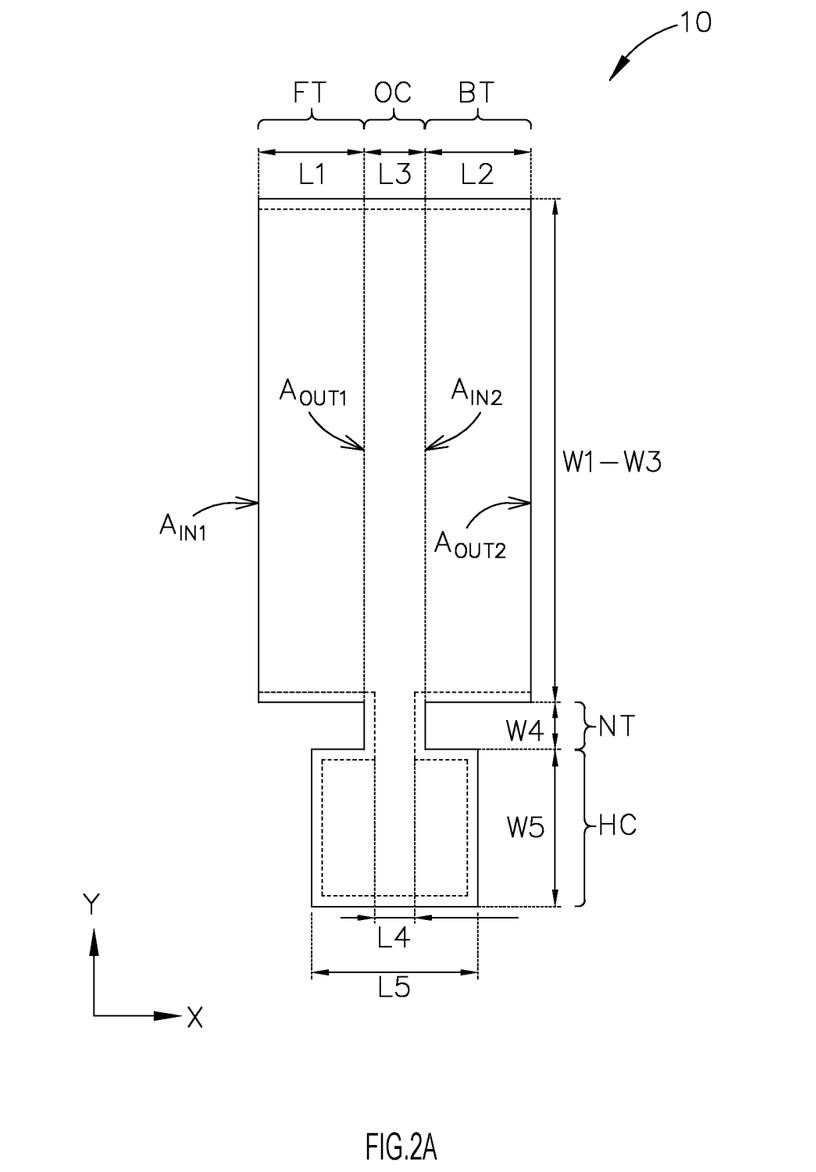
FIG. 2A is a top view (X-Y plane) of the acoustic filter according to an embodiment of the present invention.
Figure 2B:
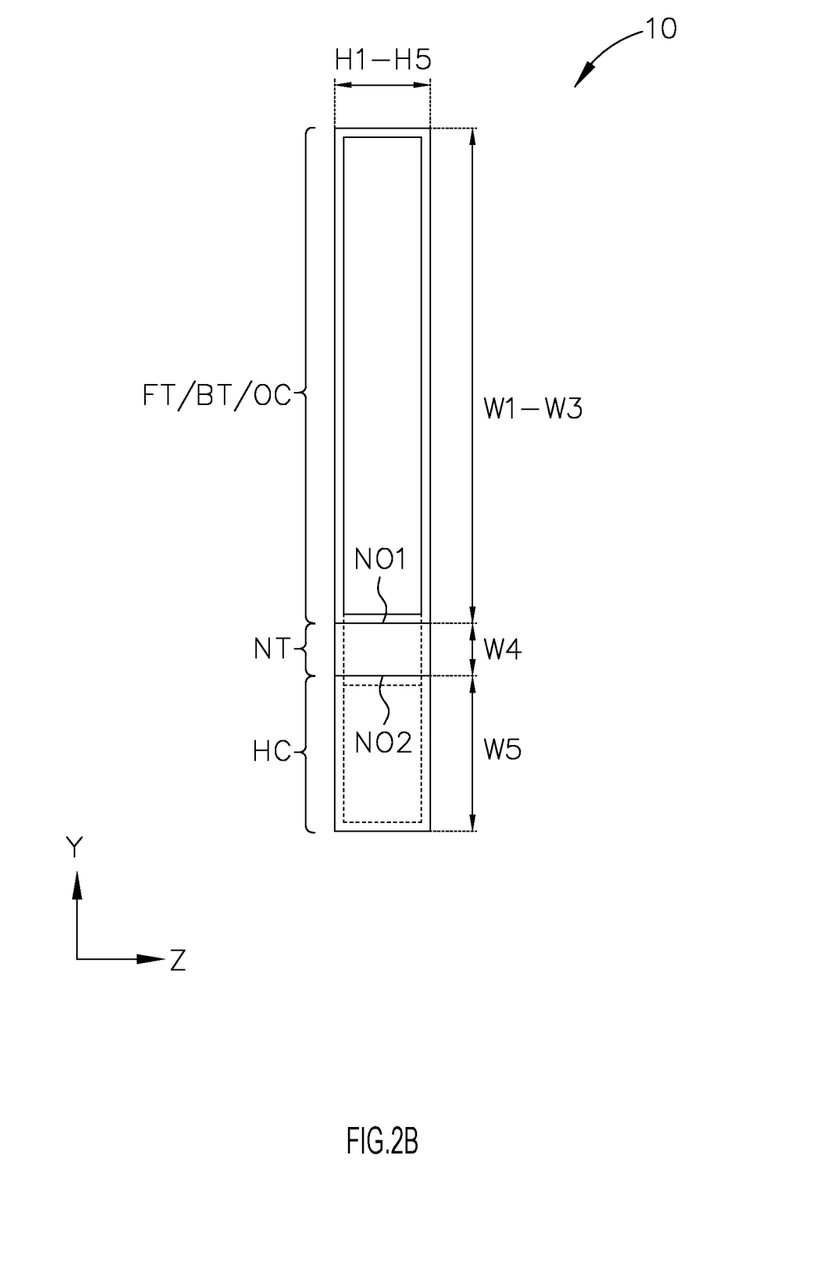
FIG. 2B is a side view (Y-Z plane) of the acoustic filter according to an embodiment of the present invention.
Figure 2C:
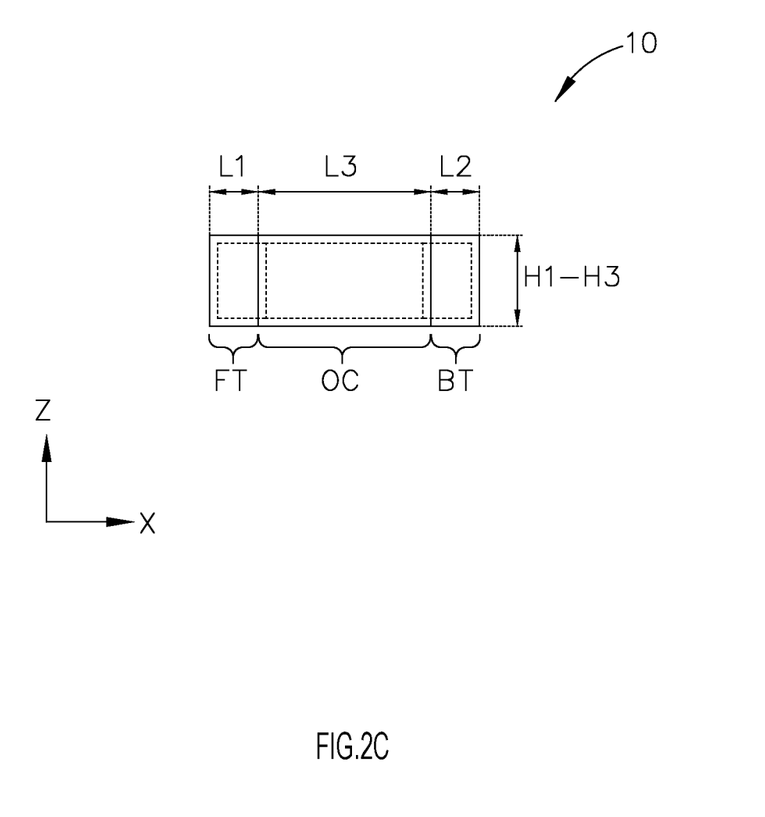
FIG. 2C is a side view (Z-X plane) of the acoustic filter according to an embodiment of the present invention.

FIG. 1 is a schematic diagram of an acoustic filter 10 according to an embodiment of the present invention. FIG. 2A is a top view (X-Y plane) of the acoustic filter 10 according to an embodiment of the present invention. FIG. 2B is a side view (Y-Z plane) of the acoustic filter 10 according to an embodiment of the present invention. FIG. 2C is a side view (Z-X plane) of the acoustic filter 10 according to an embodiment of the present invention.

As shown in FIGS. 1 and 2A-2C, the acoustic filter 10 includes a front duct FT, a back duct BT, a single expansion chamber OC, a neck channel NT, and a Helmholtz resonance cavity HC. In describing the structure of the acoustic filter 10, the three sides representing the length, width, and height are parallel to the X-axis, the Y-axis, and the Z-axis, respectively, wherein the length, width, and height of the front duct FT are denoted by L1, W1, and H1, respectively. The length, width, and height of the back duct BT are denoted by L2, W2, and H2, respectively. The length, width, and height of the single expansion chamber OC are denoted by L3, W3, and H3, respectively. The length, width, and height of the neck channel NT are denoted by L4, W4, and H4, respectively. The length, width, and height of the Helmholtz resonant cavity HC are denoted by L5, W5 and H5, respectively.

$A_{IN1}$ represents the first inlet port of the front duct FT, and $A_{OUT1}$ represents the first outlet of the front duct FT. $A_{IN2}$ represents the second inlet of the back duct BT, and $A_{OUT2}$ represents the second outlet of the back duct BT. The first inlet $A_{IN1}$ of the front duct FT is also the "sound-receiving port" of the acoustic filter 10, and its cross-sectional area is defined by the width and height of the front duct FT. That is, the cross-sectional area of the first inlet port $A_{IN1}$ (i.e., the sound-receiving port) of the acoustic filter 10 is W1*H1. The second air outlet $A_{OUT2}$ of the back duct BT is also the "sound outlet" of the acoustic filter 10, and its cross-sectional area is defined by the width and height of the back duct BT. That is, the cross-sectional area of second air outlet $A_{OUT2}$ (i.e., the sound outlet) of the filter 10 is W2*H2.

The neck channel NT is connected to the single expansion chamber OC through a first opening NO1, and is connected to the Helmholtz resonance cavity HC through a second opening NO2, wherein the passageways of the first opening NO1 and the second opening NO2 are perpendicular to the passageways of the first inlet port $A_{IN1}$. The cross-sectional area of the passageways of the first opening NO1 and the second opening NO2 of the neck channel NT is L4*H4.

Figure 3:
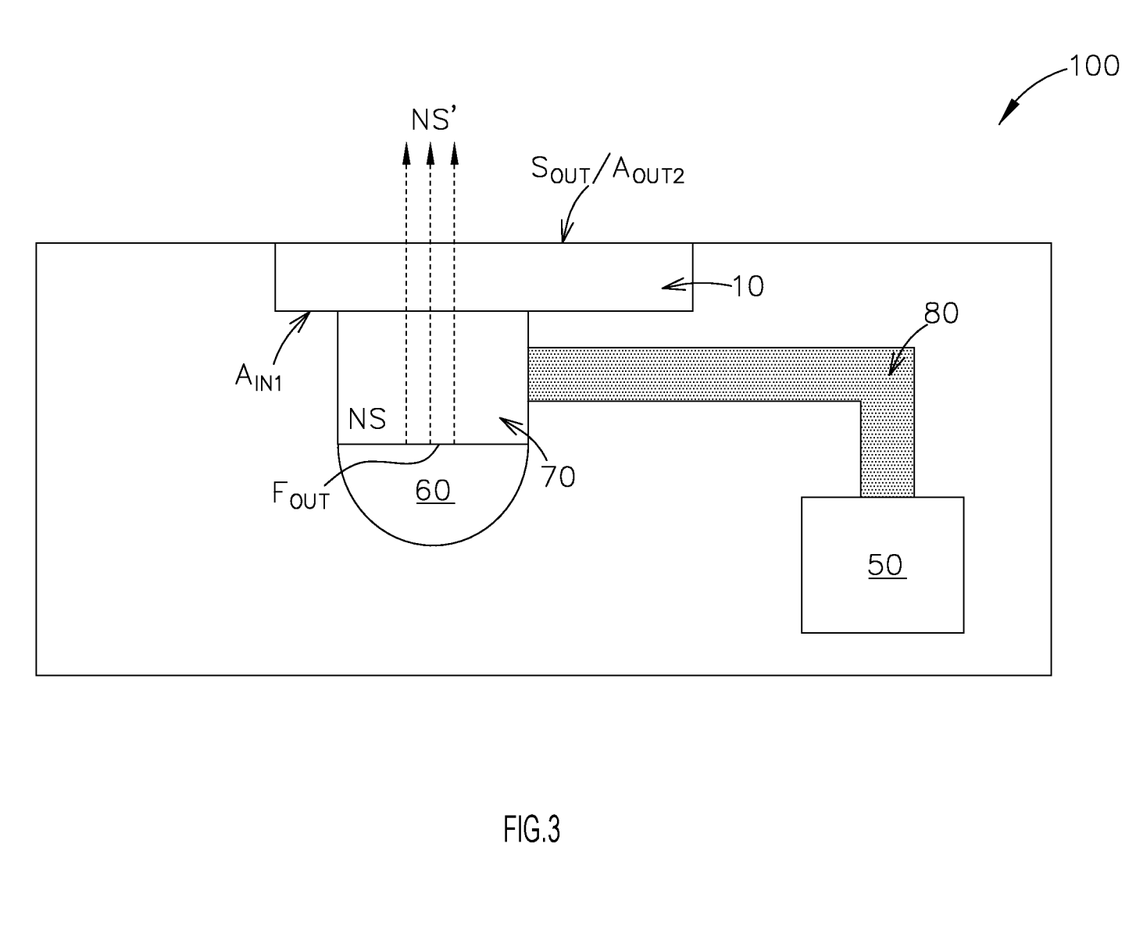
FIG. 3 is a schematic diagram of an electronic system with heat dissipation and noise reduction functionality according to an embodiment of the present invention.

FIG. 3 is a schematic diagram of an electronic system 100 with heat dissipation and noise reduction capabilities according to an embodiment of the present invention. The electronic system 100 includes an acoustic filter 10, a processor 50, a fan 60, a heat sink 70, and a heat pipe 80. The processor 50, which is the main source of heat, is configured to control the operation of various components in the electronic system 100. The heat sink 70 and the heat pipe 80 are configured to conduct heat generated by the processor 50 to the fan air outlet $F_{OUT}$, and then air pushed by the fan 60 discharges the heat energy through the system air outlet or vent $S_{OUT}$ of the electronic system 100.

The acoustic filter 10 is disposed between the system air outlet $S_{OUT}$ of the electronic system 100 and the heat sink 70, and is configured to filter the noise NS generated by the fan 60. When the noise NS is generated, frequency components thereof below a cutoff frequency are eliminated by the acoustic filter 10. That is, the acoustic filter 10 may be tuned to eliminate one or more specific frequency components in the noise NS.

In the embodiment of the present invention, the acoustic filter 10 has an asymmetric structure, wherein a central axis of the first inlet port AIN1 of the front duct FT, a central axis of the cavity of the single expansion chamber OC, and a central axis of the second air outlet AOUT2 of the back duct BT do not correspond to a central of the fan 60. That is, the acoustic filter 10, as shown in FIG. 3, is offset from a central axis of the fan 60.

The noise NS generated when the fan 60 is operating passes through the heat sink 70, and is then subjected to noise reduction processing by the acoustic filter 10, so that attenuated noise NS' is passed to the system air outlet SOUT of the electronic system 100. That is, the sound pressure level (dB SPL) of attenuated noise NS' is lower than the sound pressure level of noise NS. In the present invention, the first inlet port $A_{IN1}$ of the acoustic filter 10 is airtightly connected to the heat sink 70, and the second sound outlet $A_{OUT2}$ of the acoustic filter 10 is airtightly connected to the air outlet $S_{OUT}$ of the electronic system 100. In addition, the first inlet port $A_{IN1}$ of the acoustic filter 10 may have the same cross-sectional area as the fan air outlet $F_{OUT}$ of the fan 60, so the heat dissipation effect of the acoustic fan 60 is preferably not affected.

Figure 4:
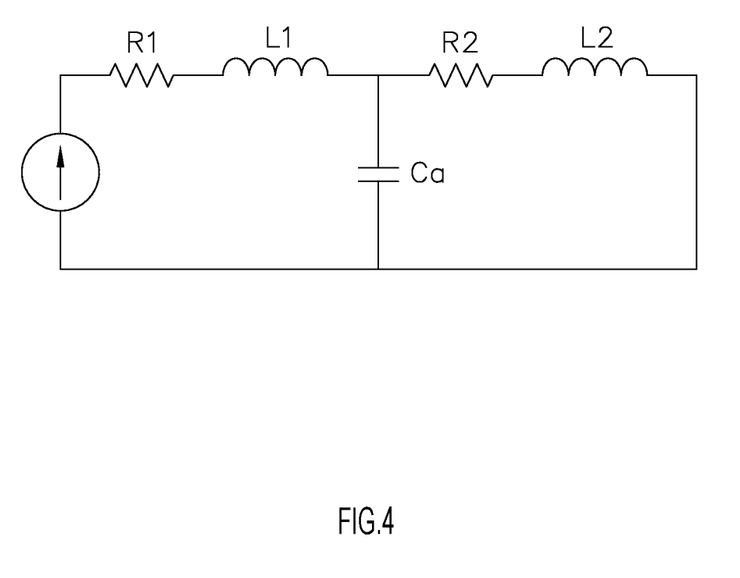
FIG. 4 is an equivalent electronic circuit diagram of the acoustic filter consistent with the embodiments of the present invention.

FIG. 4 is an equivalent circuit diagram of the front duct FT, the single expansion chamber OC, and the back duct BT of the acoustic filter 10 according to an embodiment of the present invention during operation. The front duct FT, the single expansion chamber OC, and the back duct BT in the acoustic filter 10 of the present invention operate akin to a low-pass filter, wherein the resistor R1 and the inductance L1 represent the contribution of the front duct FT, the capacitor Ca represents the contribution of the single expansion chamber OC, and resistor R2 and inductor L2 represent the contribution of the back duct BT. The cutoff frequency of the acoustic filter 10 is related to the capacitance Ca, and the value of the capacitance Ca is determined by the structure of the single expansion chamber OC. The larger the volume of the single expansion chamber OC, the greater the value of the capacitance Ca, leading to a higher cutoff frequency value for the acoustic filter 10.

It is noted that the neck channel NT and the Helmholtz resonant cavity HC in the acoustic filter 10 of the present invention can generate anti-phase resonant sound waves RW to offset the noise NS generated by the fan 60 during operation, and the frequency fo of the anti-phase resonant sound waves RW is shown in the formula below, where c represents the speed of sound in the environment, S represents the cross-sectional area of the neck channel NT, V represents the static volume of the Helmholtz resonator HC, and L represents the equivalent length of the neck channel NT and the Helmholtz resonator HC.

That is, the natural frequency of a Helmholtz resonator is:

$$f_0 = \frac{c}{2\pi}\sqrt{\frac{S}{VL}}.$$

In one implementation of the acoustic filter 10, the length L1 of the front duct FT is less than 5 mm, the width W1 may be 70 mm, and the height H1 may be 7 mm; the length L2 of the back duct BT is less than 5 mm, the width W2 may be 70 mm, and the height H2 may be 7 mm; the length L3 of the single expansion chamber OC may be 10 mm or 15 mm, the width W3 may be 70 mm, and the height H3 may be 7 mm; the length L3 of the single expansion chamber OC may be 10 mm or 15 mm, the width W3 may be 70 mm, and the height H3 may be 7 mm. In the acoustic filter 10, the front duct FT, the back duct BT, and the single expansion chamber OC with the above-mentioned dimensions can filter out fan noise below 2 KHz. Those skilled in the art will appreciate that the actual dimensions of the front duct FT, the back duct BT, and the single expansion chamber OC in the acoustic filter 10 should not be construed as limiting the scope of the present invention.

In another implementation of the acoustic filter 10, the length L4 of the neck channel NT may be 10 mm, the width W4 may be 10 mm, 20 mm, 40 mm or 60 mm, and the height H3 may be 7 mm; the length L5 of the Helmholtz resonant cavity HC may be 20 mm, the width W5 may be 23 mm, and the height H5 may be 7 mm. The neck channel NT and the Helmholtz resonant cavity HC with the above-mentioned dimensions in the acoustic filter 10 can convert the frequency of the fan noise from the drum reference point (DRP) to the ear reference point (ERP) with a frequency of 3.4 KHz, and noise suppression is approximately 5 dBA. Those skilled in the art will appreciate that the actual size of the neck channel NT and the Helmholtz cavity HC in the acoustic filter 10 should not be construed as limiting the scope of the present invention.

In an embodiment of the present invention, the width W1 of the front duct FT, the width W2 of the back duct BT, and the width W3 of the single expansion chamber OC in the acoustic filter 10 are the same, and the width W1 of the front duct FT and the width W2 of the back duct BT are the same. And the width W3 of the single expansion chamber OC is greater than the width W4 of the neck channel NT and the width W5 of the Helmholtz resonant cavity HC.

In an embodiment of the present invention, in the acoustic filter 10, the height H1 of the front duct FT, the height H2 of the back duct BT, the height H3 of the single expansion chamber OC, the height H4 of the neck channel NT, the height H5 of the Helmholtz resonant cavity HC is the same as the height of the fan 60 for and optimized match to fan 60 for improved heat dissipation performance.

In an embodiment of the present invention, the electronic system 100 may be a notebook computer, or other electronic devices with limited body space. However, those skilled in the art will appreciate that the type of the electronic system 100 should not be considered as limiting the scope of the present invention.

In sum, in the electronic system of the present invention, the fan can provide heat dissipation functionality, and the acoustic filter can reduce the noise generated when the fan operates. The acoustic filter of the present invention filters out noise below a cut-off frequency through a low-pass filter formed by the front duct, the single expansion chamber, and the back duct, and eliminates DRP-ERP noise. As such, the present invention provides both heat dissipation and noise reduction capabilities.

The above description is intended by way of example only.

What is claimed is:

1. An electronic system, comprising: a system air vent; a heat sink; a fan disposed adjacent a first side of the heat sink;

and an acoustic filter disposed between the system air vent and a second side of the heat sink, wherein the acoustic filter comprises an expansion chamber and a resonant cavity connected to the expansion chamber via a neck channel; wherein the expansion chamber has a cross sectional area that is the same as a cross sectional area of an outlet of the fan.

2. The electronic system of claim 1, wherein the acoustic filter comprises a front duct that is airtightly connected to the second side of the heat sink.

3. The electronic system of claim 2, wherein the acoustic filter comprises a back duct that has the same dimensions as the front duct.

4. The electronic system of claim 3, wherein the back duct is airtightly connected to the system air vent.

5. The electronic system of claim 3, wherein the expansion chamber is disposed between the front duct and the back duct.

6. The electronic system of claim 3, wherein a central axis of the front duct, a central axis of the expansion chamber, and a central axis of the back duct do not correspond to a central of the fan.

7. The electronic system of claim 1, wherein the resonant cavity is a Helmholtz resonant cavity.

8. The electronic system of claim 1, wherein a cross-sectional area of a passageway through the neck channel is less than a cross-sectional area of the resonant cavity.

9. The electronic system of claim 1, wherein a height of the expansion chamber and a height of the resonant cavity are the same.

10. The electronic system of claim 1, wherein a length of the expansion chamber is greater than a length of the resonant cavity.

11. An electronic system, comprising:
a system air vent;
a heat sink;
a fan disposed adjacent a first side of the heat sink; and
an acoustic filter disposed between the system air vent and a second side of the heat sink, wherein the acoustic filter comprises a front duct, a back duct, an expansion chamber disposed between the front duct and the back duct, and a resonant cavity connected, via a neck channel, to the expansion chamber between the front duct and the back duct.

12. The electronic system of claim 11, wherein the expansion chamber has a cross sectional that is the same as a cross sectional area of an outlet of the fan.

13. The electronic system of claim 11, wherein the back duct is airtightly connected to the system air vent.

14. The electronic system of claim 11, wherein a central axis of the front duct, a central axis of the expansion chamber, and a central axis of the back duct do not correspond to a central of the fan.

15. The electronic system of claim 11, wherein the resonant cavity is a Helmholtz resonant cavity.

16. The electronic system of claim 11, wherein a cross-sectional area of a passageway through the neck channel is less than a cross-sectional area of the resonant cavity.

17. The electronic system of claim 11, wherein a height of the expansion chamber and a height of the resonant cavity are the same.

18. The electronic system of claim 11, wherein a length of the expansion chamber is greater than a length of the resonant cavity.

* * * * *